(12) United States Patent
Crowley et al.

(10) Patent No.: US 6,397,936 B1
(45) Date of Patent: Jun. 4, 2002

(54) FREEZE-TOLERANT CONDENSER FOR A CLOSED-LOOP HEAT-TRANSFER SYSTEM

(75) Inventors: Christopher J. Crowley, Orford; Nabil A. Elkouh, Meriden, both of NH (US)

(73) Assignee: Creare Inc., Hanover, NH (US)

( * ) Notice: Subject to any disclaimer, the term of this patent is extended or adjusted under 35 U.S.C. 154(b) by 0 days.

(21) Appl. No.: 09/570,460

(22) Filed: May 12, 2000

Related U.S. Application Data

(60) Provisional application No. 60/134,305, filed on May 14, 1999.

(51) Int. Cl.[7] ............................................. F28D 15/00
(52) U.S. Cl. ......................... 165/104.26; 165/104.33; 165/80.4; 165/185; 122/366; 361/700; 174/15.2; 257/715; 29/890.032
(58) Field of Search ................... 165/185, 104.26, 165/80.4, 104.33, 104.34, 104.27; 361/699, 700; 174/15.1, 15.2; 257/715, 714, 716; 122/366; 29/890.032

(56) References Cited

U.S. PATENT DOCUMENTS

| | | | | |
|---|---|---|---|---|
| 3,779,310 A | * | 12/1973 | Russell ................... | 165/104.26 |
| 3,828,849 A | * | 8/1974 | Cornan et al. .......... | 165/104.26 |
| 3,844,342 A | * | 10/1974 | Eninger et al. ......... | 165/104.26 |
| 3,901,311 A | | 8/1975 | Kosson et al. ............... | 165/105 |
| 3,952,798 A | | 4/1976 | Jacobson et al. ............ | 165/105 |
| 3,971,435 A | | 7/1976 | Peck ............................. | 165/78 |
| 4,003,427 A | | 1/1977 | Leinoff et al. ............... | 165/105 |
| 4,058,159 A | * | 11/1977 | Iriarte ...................... | 165/104.26 |
| 4,170,262 A | | 10/1979 | Marcus et al. ............... | 165/105 |
| 4,231,423 A | | 11/1980 | Haslett ......................... | 165/105 |
| 4,300,626 A | | 11/1981 | Busse et al. ................... | 165/96 |
| 4,577,381 A | * | 3/1986 | Sato et al. ............. | 29/890.032 |
| 4,765,396 A | | 8/1988 | Seidenberg ............ | 165/104.26 |
| 4,815,529 A | | 3/1989 | Miyazaki et al. ...... | 165/104.26 |
| 4,883,116 A | | 11/1989 | Seidenberg et al. .... | 165/104.26 |
| 4,884,627 A | * | 12/1989 | Abtahi ................... | 165/104.26 |
| 4,903,761 A | | 2/1990 | Cima ..................... | 165/104.25 |
| 4,934,160 A | | 6/1990 | Mueller ....................... | 62/515 |
| 5,046,553 A | | 9/1991 | Lindner ................. | 165/104.26 |
| 5,076,352 A | | 12/1991 | Rosenfeld et al. ..... | 165/104.26 |
| 5,303,768 A | * | 4/1994 | Alario et al. ................ | 122/366 |
| 5,346,000 A | * | 9/1994 | Schlitt ........................ | 122/366 |
| 5,944,092 A | * | 8/1999 | Van Oost ............... | 165/104.26 |
| 6,070,654 A | * | 6/2000 | Ito ......................... | 165/104.33 |
| 6,269,865 B1 | * | 8/2001 | Huang .................... | 165/104.26 |

* cited by examiner

Primary Examiner—Ira S. Lazarus
Assistant Examiner—Terrell McKinnon
(74) Attorney, Agent, or Firm—Downs Rachlin Martin PLLC

(57) ABSTRACT

A freeze tolerant condenser (106) for a two-phase heat transfer system is disclosed. The condenser includes an enclosure (110) and a porous artery (112) located within and extending along the length of the enclosure. A vapor space (116) is defined between the enclosure and the artery, and a liquid space (114) is defined by a central passageway within the artery. The artery includes a plurality of laser-micromachined capillaries (130) extending from the outer surface of the artery to its inner surface such that the vapor space is in fluid communication with the liquid space. In one embodiment of the invention, the capillaries (130) are cylindrical holes having a diameter of no greater than 50 microns. In another embodiment, the capillaries (130') are slots having widths of no greater than 50 microns. A method of making an artery in accordance with the present invention is also disclosed. The method includes providing a solid-walled tube and laser-micromachining a plurality of capillaries into the tube along a longitudinal axis, wherein each capillary has at least one cross-sectional dimension transverse to the longitudinal axis of less than 50 microns.

41 Claims, 3 Drawing Sheets

FREEZE-TOLERANT CONDENSER FOR A CLOSED-LOOP HEAT-TRANSFER SYSTEM

RELATED APPLICATION

This application claims priority from U.S. Provisional Application Serial No. 60/134,305, filed May 14, 1999.

This invention was made with Government support under contract NAS9-97183 awarded by NASA. The Government has certain rights in the invention.

FIELD OF THE INVENTION

The present invention relates to the general field of heat-transfer devices. More particularly, the present invention is directed to a freeze-tolerant condenser for a closed-loop heat transfer system.

BACKGROUND OF THE INVENTION

Waste heat is generated aboard all types of spacecraft by propulsion systems, electrical systems, on-board experiments, human metabolic processes and the like. To avoid overheating of these sources, the waste heat must be conveyed away from the heat source to a heat sink located either within the spacecraft, e.g., to heat a region of the spacecraft that does not have its own heat source, or outside the spacecraft to rid the spacecraft entirely of the waste heat.

One type of system used for transporting heat from a waste heat source to a heat sink is a capillary pump loop (CPL) system, which is a highly-efficient system requiring little or no external power. A CPL system is a two-phase system that utilizes a vaporizable liquid, or working fluid. Ammonia is the most desirable working fluid because it has a very good heat-transfer ability. Heat is absorbed by the working fluid when it is changed from a liquid phase to a vapor phase upon evaporation, and heat is released from the working fluid when condensation of the vapor occurs. The CPL system includes a heat pipe containing a capillary structure, such as a porous wick, and a continuous loop that provides a vapor phase flow region, a condenser region and a liquid return region.

Referring now to FIG. 1, there is shown a conventional condenser assembly 10 used in a CPL system. The condenser assembly comprises a condenser tube 12 and a radiator panel 14, or heat sink, in thermal communication with condenser tube 12. Condenser tube 12 has an inlet 16 and an outlet 18. When condenser assembly 10 is part of a closed loop, two-phase heat-transfer system, inlet 16 is in fluid communication with an outlet of an evaporator (not shown) and outlet 18 is in fluid communication with an inlet of the evaporator. The evaporator collects waste heat from one or more heat sources aboard the spacecraft in a manner known in the art.

During normal operation, the closed-loop system is charged with a working fluid, such as ammonia. The working fluid is in its liquid phase when it enters the evaporator. As the working fluid moves through the evaporator, waste heat collected by the evaporator is transferred to the working fluid, thereby changing the working fluid from its liquid state to its vapor state. The working fluid vapor then exits the evaporator and enters condenser assembly 10 through inlet 16 of condenser tube 12. As the working fluid flows through condenser tube 12, it gives up heat to radiator panel 14 and condenses into its liquid phase. The condensate then exits from outlet 18 and returns to the evaporator where it is heated and vaporized by the waste heat. At the design heat load, entire radiator panel 14 is nearly isothermal, i.e., the temperature is uniform along the entire length and across the entire width of radiator panel 14.

A problem with conventional condenser assemblies arises when the heat load is less than the design heat load. Because the boundary conditions for the condenser tube inlet temperature of the working fluid and the heat sink temperature remain the same even when the heat load is reduced, radiator panel 14 rejects more heat than is carried by the working fluid flowing into condenser assembly 10. When this happens, the working fluid exits condenser assembly 10 in a highly sub-cooled state. Sub-cooling can drastically reduce the efficiency of the CPL system because there may not be enough waste heat to overcome the sub-cooling to allow the liquid working fluid to evaporate. Since it is desirable to have only a small sub-cooling for a near-isothermal boundary condition on the radiator panel, the amount of sub-cooling must be reduced.

Currently, there are two approaches to eliminating large sub-cooling. The first approach is to add heat to the system, either directly to radiator panel 14 or to the working fluid before it reaches the evaporator. A problem with this approach is that the extra power needed to supply the additional heat is usually not available due to the need to keep power generating systems as small and lightweight as possible. The second approach is to bypass some of the vapor exiting the evaporator directly to the liquid exiting the condenser assembly 14 to pre-heat the liquid before it returns to the evaporator. A problem with this approach is that it requires active mechanical controls that are rife with possibilities for mechanical failures that cannot be tolerated in spacecraft applications. In addition, this approach requires that the vapor phase be introduced into the liquid phase, which may cause flow instabilities or even destructive condensation-induced waterhammer events.

Another problem with conventional condenser assembly 14 arises when the effective heat sink temperature of the radiator panel falls below the freezing point of the working fluid, which, as noted above, is typically ammonia. In such case, the working fluid can freeze at heat loads less than the design heat load. The frozen working fluid forms a plug in condenser tube 12 that shuts down the entire CPL system by preventing the remaining unfrozen working fluid from flowing and transporting waste heat away from the evaporator. The present remedy for this situation is to provide a supplementary heater and control system therefor to radiator panel 14, but this adds unnecessary weight. Another approach is to select a different working fluid having a lower freezing point. However, all of the known fluids that do not freeze at low operating temperatures have very low heat-transfer ability in comparison to ammonia.

SUMMARY OF THE INVENTION

The present invention is directed to an artery for heat-transfer device. The artery comprises a side wall having an outer surface, an inner surface and a plurality of capillaries formed therein. Each capillary extends from the outer surface to the inner surface along a longitudinal axis and has a side wall including a surface having formations thereon formed by melting and subsequent re-solidification of the side wall of the capillary. Each capillary also is linear, has a substantially uniform cross-sectional shape transverse to the longitudinal axis, and has at least one dimension transverse to the longitudinal axis that is no greater than 50 microns.

In another aspect, the present invention is directed to a two-phase heat-transfer system utilizing a working fluid. The system comprises a condenser that includes an enclosure having an interior surface and a length. The enclosure contains a first interior space and a second interior space. The enclosure is provided for containing the working fluid. A partition is located within and extends along at least a portion of the length of the enclosure. The partition separates the first interior space from the second interior space and has a plurality of capillaries formed therein. Each capillary extends from the outer surface to the inner surface along a longitudinal axis and has a side wall including a surface having formations thereon formed by melting and subsequent re-solidification of the side wall. Each capillary also is linear, has a substantially uniform cross-sectional shape transverse to the longitudinal axis, and has at least one dimension transverse to the longitudinal axis that is no greater than 50 microns.

In yet another aspect, the present invention is directed to a heat-transfer system utilizing a working fluid. The system comprises a condenser assembly that includes a plurality of condensers, a heat sink, a first header and a second header. Each condenser includes an enclosure having an interior surface and a length. The enclosure contains a first interior space and a second interior space. The enclosure is provided for containing the working fluid. A partition is located within and extends along at least a portion of the length of the enclosure. The partition separates the first interior space from the second interior space and has a plurality of capillaries formed therein. The heat sink is in thermal communication with the enclosure of each condenser. The first header is in fluid communication with the first interior space of each of the condensers, and the second header is in fluid communication with the second interior space of each of the condensers.

The present invention is also directed to a method of forming an artery for a two-phase heat-transfer system. The method comprises the steps of providing a solid-walled body having an outer surface and an inner surface and laser-micromachining a plurality of capillaries into the body. Each capillary extends from the outer surface to the inner surface along a longitudinal axis and has at least one cross-sectional dimension transverse to the longitudinal axis of less than 50 microns.

BRIEF DESCRIPTION OF THE DRAWINGS

For the purposes of illustrating the invention, the drawings show a form in which the invention may be embodied. It should be understood, however, that the invention is not limited to the precise arrangements and instrumentalities shown.

DETAILED DESCRIPTION OF THE INVENTION

Figure 2:
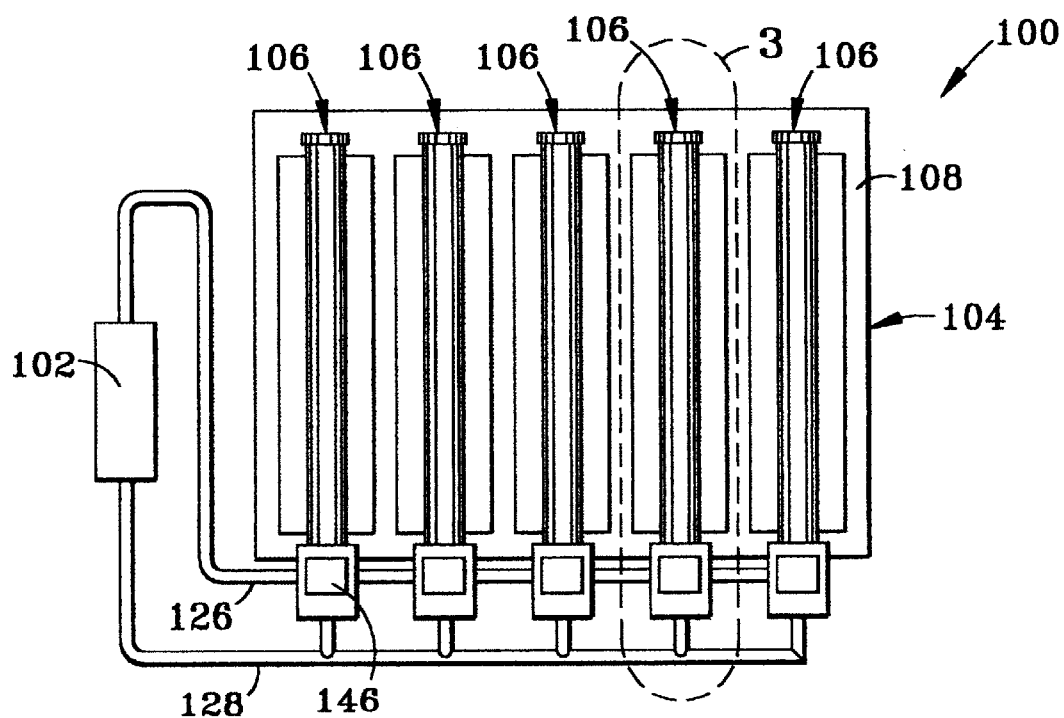
FIG. 2 is a plan view illustrating a closed-loop heat-transfer system incorporating a condenser assembly according to the present invention.

Referring to the drawings, wherein like elements are indicated by like numerals, FIG. 2 shows a closed-loop heat-transfer system, which is denoted generally by the numeral 100. System 100 includes an evaporator 102 and a condenser assembly 104 according to the present invention. System 100 may be used in any application where a conventional closed-loop heat-transfer system, such as a CPL system aboard a spacecraft, a loop heat pipe (LHP) system for cooling electronic circuitry at a remote radar installation or the like, would be used.

Evaporator 102 collects waste heat from one or more heat sources and transfers the collected heat to a working fluid contained within system 100. The heated working fluid is then transported to condenser assembly 104, where the waste heat is efficiently transferred to the ambient environment surrounding condenser assembly 104. Beneficially, as described in detail below, condenser assembly 104 prevents the working fluid from being over sub-cooled and allows the heat-transfer system to continue operating in and rapidly recover from a fully or partially frozen state.

Figure 1:
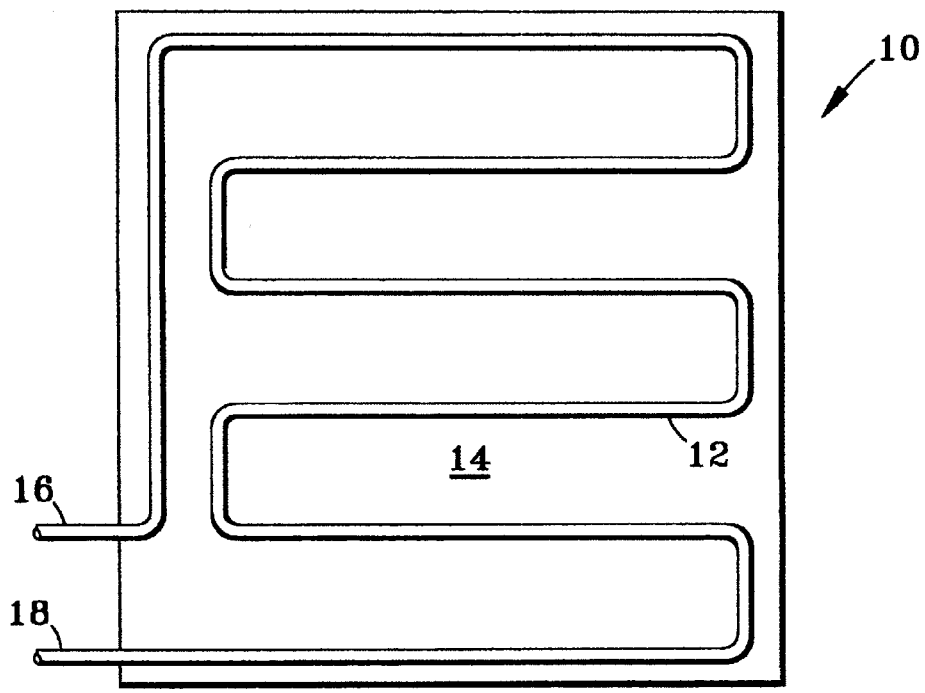
FIG. 1 is a plan view illustrating a prior art condenser assembly.

Condenser assembly 104 includes five condensers 106 attached to and in thermal communication with a heat sink, such as radiator panel 108 shown. In comparison to a prior art condenser assembly, such as that shown in FIG. 1, the parallel arrangement of condensers 106 beneficially provides a lower pressure drop between the inlet and outlet of condenser assembly 104, which allows condensers 106 to be smaller in size and lighter in weight than corresponding components, such as condenser tube 12 of FIG. 1, of a conventional system. Although five condensers 106 are shown, any number of condensers may be used depending on the design heat load and boundary conditions of the heat sink. Condensers 106 need not be linear as shown, but rather may be arcuate, circuitous or the like to suit a particular design. One skilled in the art will appreciate the various configurations of condenser assemblies that may be made using the basic structure of condensers 106 described below.

Radiator panel 108 should be made of a material having a relatively high thermal conductance, such as brass. Other acceptable materials include aluminum, copper, carbon composites and the like. Alternatively to single radiator panel 108 shown, the heat sink may comprise two radiator panels located on opposite sides of condensers 106 to form a sandwich configuration. Furthermore, a convective heat sink may be used in place of or to complement a radiator-type heat sink. One skilled in the art will recognize the variety of heat sinks that may be used to make a condenser assembly 104 according to the present invention.

Figure 3:
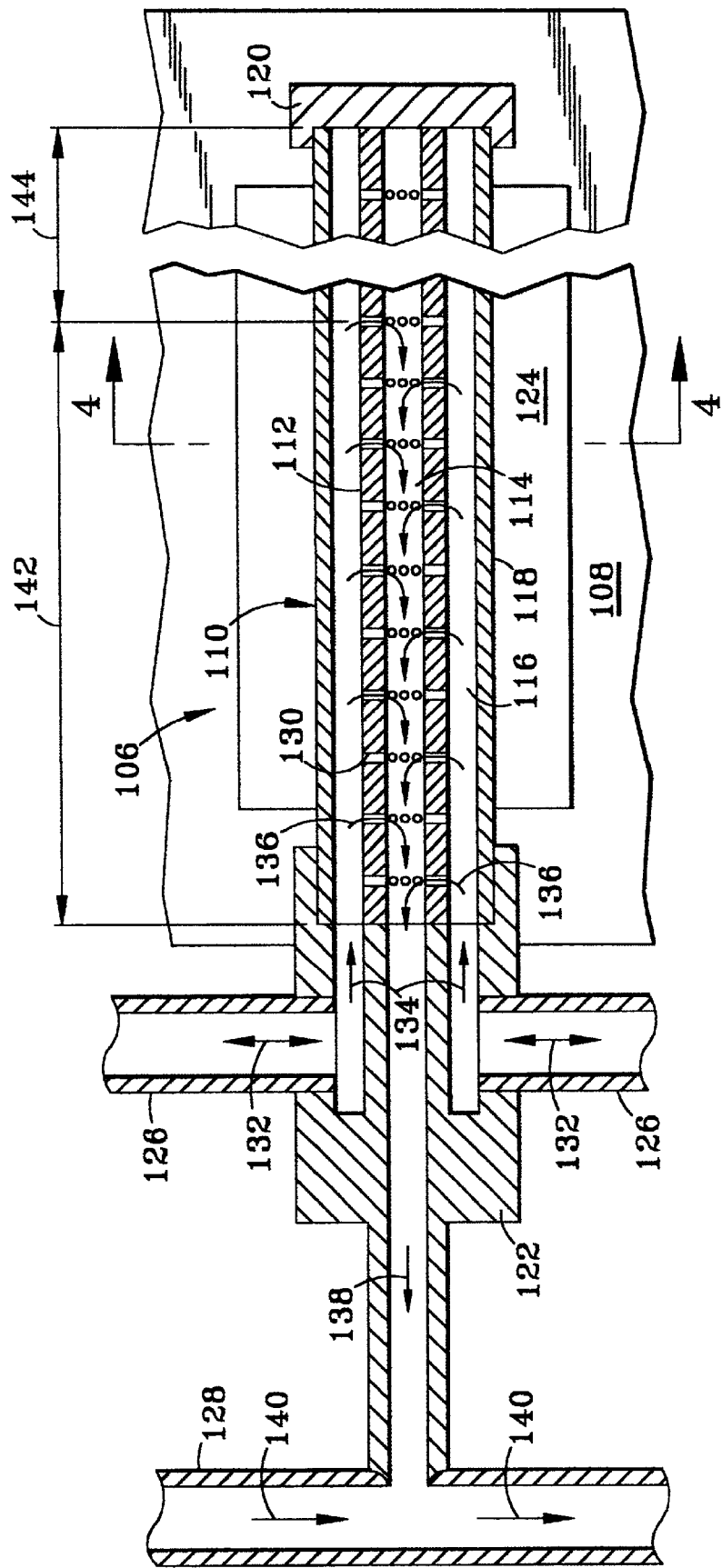
FIG. 3 is an enlarged detail and cross-sectional view of one of the condensers of the assembly shown in FIG. 2.
Figure 4:
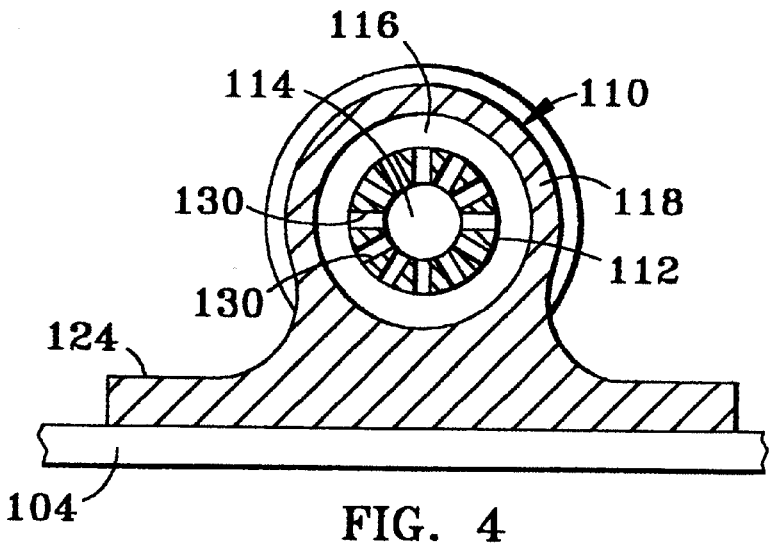
FIG. 4 is a cross-sectional view of one of the condensers taken along line 4—4 of FIG. 3.

As shown in FIGS. 3 and 4, each condenser 106 includes an elongated enclosure 110 and a porous artery 112 located within and extending the length of enclosure 110. Artery 112 forms a partition that defines a liquid space 114 and a vapor space 116 within enclosure 110. As described below, vapor space 116 may include both liquid and vapor. Thus, as used below, the term "vapor space" is not limited to a space containing exclusively vapor. Moreover, the flow in system 100 may be reversed wherein liquid space 114 becomes the vapor space and vapor space 116 becomes the liquid space.

Enclosure 110 comprises a body 118 having a cap 120 at one end and a coaxial fitting 122 at the opposite end. Preferably, artery 112 is positioned concentric with body 118. However, artery 112 may be positioned non-concentrically within body 118 as well. Body 118 is preferably made of a material having a relatively high thermal conductance, such as aluminum. Other acceptable materials include copper, stainless steel, carbon composites and the like. Enclosure 110 preferably has a circular cross-sectional shape, but may have another cross-sectional shape, such as square, oval, hexagonal or the like.

Body 118 includes a base 124 to facilitate attaching condenser 106 to radiator panel 108 by welding, mechanical fastening, adhesive bonding or the like. Base 124 may be formed integral with body 118, for example, using an extrusion process. Alternatively, base 124 may be formed separately from body 118 and attached thereto by welding, adhesive bonding or the like. In addition, base 124 may be eliminated and body 118 may be provided with fins that take the place of radiator panel 108.

Cap 120 closes the adjacent ends of body 118 and artery 112 and holds these ends in fixed relationship to one another. Alternatively, the ends may be closed by separate structures which are either formed integrally with the respective elements or formed separately from the respective elements and attached thereto by welding, adhesive bonding or the like.

Coaxial fitting 122 allows vapor space 116 and liquid space 114 to be independently connected to and in fluid communication with a vapor header 126 and a liquid header 128, respectively. Furthermore, coaxial fitting 122 holds artery 112 in spaced apart relationship to body 118. Liquid header 128 is in fluid communication with an inlet end evaporator 102. Similarly, vapor header 126 is in fluid communication with an outlet end evaporator 102. Although coaxial fitting 122 is shown, one skilled in the art will recognize that there are various other means for independently connecting vapor space 116 and liquid space 114 to the corresponding header.

Figure 5:
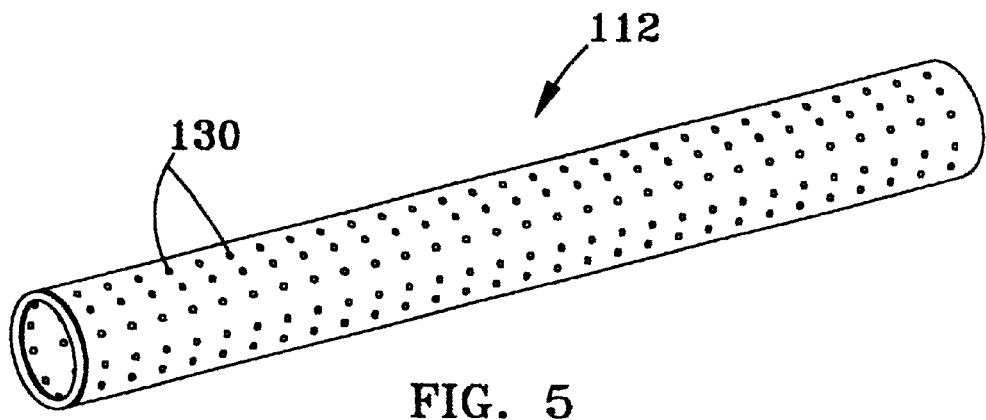
FIG. 5 is a perspective view of the artery shown in FIG. 3.

Turning now to FIGS. 3–5, porous artery 112 includes a plurality of capillaries 130 extending between its outer and inner surfaces such that vapor space 112 is in fluid communication with liquid space 114. Porous artery 112 is preferably a solid-wall tube made of an extruded metal, such as stainless steel, having capillaries 130 subsequently formed therein, preferably by laser-micromachining. However, artery 112 may also be made of another type of metal, a polymer, a ceramic material or the like. Although a solid-wall tube is preferred, artery 112 may comprise a rolled screen, an extruded porous polymer tube or the like. In addition, cross-sectional shapes other than the circular shape shown, such as square, oval, hexagonal or the like, may be used.

Capillaries 130 provide condenser assembly 104 with two main functions. First, capillaries 130 function as a separator that keeps the vapor phase in vapor space 116 separated from the liquid phase in liquid space 114. Second, capillaries 130 provide capillary pumping of the liquid phase working fluid needed to return the condensate to the evaporator.

Preferably, capillaries 130 provide artery 112 with both a high permeability and a high capillary head. A high permeability reduces the differential pressure between vapor space 116 and liquid space 114 and permits relatively high flow rates through a closed-loop system. A relatively low differential pressure allows the wall thickness of artery 112 to be relatively thin, which reduces the weight of condenser assembly 104. Preferably, the permeability of artery 112 is at least $1 \times 10^{-15}$ m².

A high capillary head increases the capillary pumping ability of artery 112 and increases the bubble point, the pressure at which vapor blows through the capillaries from vapor space 116 to liquid space 114. The capillary head of artery 112 must be greater than the pressure drop between vapor header 126 and liquid header 128 to prevent vapor blow-through.

In FIG. 3 each capillaries 130 has a circular cross-sectional shape transverse to a longitudinal axis radial to the longitudinal axis of artery 112. The cross-sectional shape of each capillary 130 is preferably uniform along the longitudinal axis of that capillary. Capillaries 130 are uniformly spaced from one another along the length and around the circumference of artery 112, although the spacing may be varied in one or both directions to suit a particular design. The diameters of capillaries 130 should be approximately 50 microns or less. Preferably, the diameters are less than 20 microns and, most preferably, are less than approximately 6 microns. Presently, the practical lower limit for the diameters of capillaries 130 is approximately 2 microns. However, with new techniques, smaller diameters may become readily producible.

Figure 6:
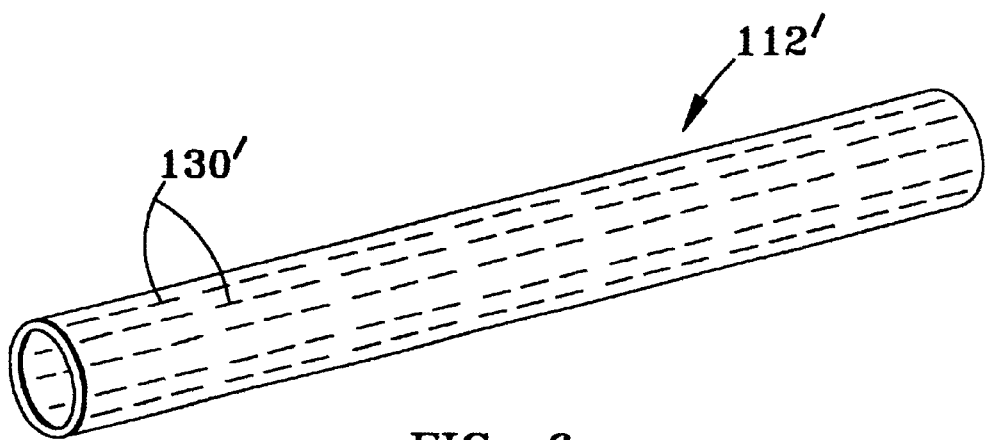
FIG. 6 is a perspective view of an alternative embodiment of an artery of the present invention.

Although capillaries 130 are preferably circular in shape, other shapes may also be used. For example, the capillaries may be longitudinal slots, radial slots, arcuate slots or the like. FIG. 6 shows an alterative embodiment of a porous artery 112' having a plurality of slotted capillaries 130'. In addition, different shapes and sizes of slots may be used with one another or in combination with cylindrical capillaries. If slots are used, their widths should be no greater than approximately 50 microns. Widths of less than 20 microns are preferable, with widths of approximately 6 microns or less being most preferred. The lengths of the slots may be any desired.

To achieve good capillary head, the minimum cross-sectional dimension of a capillary must be smaller than the length of the capillary, which, for the radial capillaries shown in FIGS. 5 and 6 is equivalent to the thickness of the wall of artery 112. For the preferred capillaries of the present invention, which have a minimum cross-sectional dimension of 50 microns or less, the preferred aspect ratio between the minimum cross-sectional dimension and the length of each capillary is 1:10. Generally, for a cylindrical capillary, the length of the capillary should be at least twice its diameter.

If it is desired to bend the porous artery, cylindrical capillaries are preferred. Cylindrical capillaries do not deform significantly when the artery is bent and, therefore, the permeability and capillary head characteristics of the artery are not detrimentally altered. If artery 112', which has slotted capillaries 130' were bent, the slots would typically deform significantly, destroying the ability of artery 112' to keep vapor from blowing through from a vapor space to a liquid space, or at least changing the permeability and capillary head characteristics of artery 112' to the detriment of it performance.

The cylindrical and slotted capillaries 130 and 130', respectively, of arteries 112 and 112' shown in FIGS. 5 and 6 are preferably formed by laser-micromachining. Laser-micromachining is performed by precisely focusing a narrow laser beam from a laser onto the outer surface of a tube and pulsing the laser until the capillary is formed in the wall of the tube by localized melting and vaporizing of the tube material. When formed in this manner, the side walls of the capillaries are characterized by formations caused by melting and subsequent re-solidification of the side walls during the vaporization of the laser-micromachining process. In addition, the side walls have a slightly inward taper from The outer surface of the tube to its inner surface. For example, a capillary having a circular cross-sectional shape has a slight frusto-conical shape. The taper is an artifact of the laser-micromachining process, wherein some of the material near the outer surface of the tube is melted and vaporized along with material nearer to the inner surface of the tube where the laser is focused. The thicker the wall in which the capillary is being formed, the greater this taper.

Moreover, another artifact of pulse vaporization is that the capillaries may have local imperfections in cross-sectional shape. For example, a desired circular cross-section may actually be slightly oval. Thus, although uniform capillaries are preferred, the capillaries end up being only substantially uniform due to the physical limitations of the forming process.

A test sample of an artery of the present invention was created by laser-micromachining an array of 5.5 micron diameter capillaries into an unannealed stainless steel tube having a 1.07 mm outside diameter and a 0.076 mm wall thickness. (Based upon testing, it appears that unannealed stainless steel is more compatible with laser-micromachining small diameter holes than annealed stainless steel.) Although the test sample was created using a tube having a relatively small outside diameter and wall thickness, the artery of the present invention may be made from tubes have smaller or larger diameters to suit a particular application.

The laser-micromachining system included a 1 watt Nd:YAG laser and a second-harmonic generator crystal to reduce the wavelength of the output beam from the laser from 1064 nm to 532 nm. The system also included an optical system for improving the focus of the beam, precision motion control equipment for positioning the tube under the focal point of the laser beam and a programmable digital control system to coordinate movement of the tube with the firing of the laser. Parameters of laser-micromachining process included a laser power of 0.01 W, a Q-switch frequency of 1.4 kHz and 420 laser firings (0.3 seconds) per capillary. Other system components includes instrumentation to diagnose the performance of the laser and a closed-circuit television system for monitoring the laser-micromachining process.

Referring now to FIGS. 2 and 3, condenser assembly 104 of the present invention operates as follows. Under design heat load, vapor from evaporator 102 flows through vapor header 126 and enters vapor space 116 of each condenser 106 as indicated by arrows 132 and 134. Arrows 132 is shown as being double-headed to indicate that the vapor in vapor header 126 may flow in either direction until the internal pressure is equalized within vapor header 126 and five condensers 106. As the vapor flows through vapor space 116, heat is transferred from the vapor to radiator panel 108, which radiates the heat into its ambient environment. As heat is transferred from the vapor, the vapor condenses into a liquid that wets the outer surface of artery 112, where it is pumped (arrows 136) into liquid space 114 by the capillary action of capillaries 130. The condensate in liquid space 110 then flows (arrow 138) to liquid header 124 where it is returned (arrows 140) to the evaporator to collect more waste heat.

In an alternative embodiment, the vapor space and the liquid space may be reversed, wherein the central passageway (element in FIG. 3) within artery 112 is the vapor space and the annular space (element in FIG. 3) surrounding artery 112 is the liquid space. Similarly, the inlet and outlet of evaporator 102 would be reversed, as would liquid header and vapor header. In this case, the operation of the condenser assembly would be similar, except that flow arrows 136, 138 and 140 would be in the reverse directions. In such an alternative embodiment, the relative sizes of the vapor space and liquid space may have to be adjusted to suit a particular design.

A beneficial feature of condenser assembly 104 is its ability to automatically, or passively, provide a constant fluid return temperature independently of the sink temperature for heat loads from approximately 3% of the design load to 100% of the design load. The limiting heat load of approximately 3% of design load represents the case where the evaporator is at saturation conditions, but there is no vapor flow to condensers. This ability to automatically provide a constant fluid return temperature essentially eliminates the sub-cooling problem sometimes experienced by conventional condenser assemblies.

As the vapor flows through vapor space 116, it becomes cooler until it finally condenses and is wicked into liquid space 114 by capillaries 130. At 100% (and greater) of design heat load, entire radiator panel 108 is nearly isothermal and the entire length of each condenser 106 is active, i.e., condensation of the working fluid occurs along the entire length of each condenser 106.

At reduced heat loads, however, radiator panel 108 is no longer isothermal, and condensation of the working fluid occurs along a length of each condenser 106 that is less than the length of vapor space 116. This smaller length defines an active region 142, which changes automatically depending on the heat load. Entire active region 142 is generally at the saturation temperature of the working fluid. Beyond active region 142 along the length of condenser 106 is an inactive region 144 in which condensation does not take place. Due to the relatively long length of each condenser in the flow direction of the working fluid, axial thermal conduction effects are relatively small. Therefore, inactive region 144 generally remains at the temperature of the heat sink (radiator panel 108).

In this manner, the temperature of the working fluid flowing into condenser assembly 104 and the temperature of the working fluid flowing out of condenser assembly 104 remain the same over a wide range of heat loads. Therefore, over-subcooling does not occur over a range of heat loads of approximately 3% of the design heat load to 100% of the design heat load.

Another beneficial feature of the condenser assembly 104 of the present invention is that it is able to operate in and recover from a fully or partially frozen state. When the heat load input to condenser assembly 104 is less than the design heat load, radiator panel 108 will not be isothermal and active region 142 of each condenser 106 will be less than the full length of that condenser, giving inactive region 144 a length greater than zero. When the temperature of radiator panel 108 is below the freezing point of the working fluid, the working fluid will freeze in inactive region 144. However, the temperature of the working fluid in active region 142 remains at the saturation temperature of the working fluid. Since the frozen inactive regions 144 of condensers 106 are distal from the inlet ends of condensers 106, vapor and liquid will continue to flow in active region 142 as long as the temperature of the active region 142 remains above the freezing point of the working fluid. Optionally, each condenser 106 may further include a starter heater 146 to re-start a closed-loop system when condenser assembly 104 is completely frozen. Preferably, starter heater 146 is located adjacent the vapor inlet end of one or more of condensers 106, such as on the corresponding coaxial fitting 122.

Although the invention has been described and illustrated with respect to the exemplary embodiments thereof, it should be understood by those skilled in the art that the foregoing and various other changes, omissions and additions may be made therein and thereto, without parting from the spirit and scope of the present invention.

What is claimed is:

1. A heat-transfer system utilizing a working fluid, comprising:

a condenser, said condenser including:
   a. an enclosure having an inner surface and a length, said enclosure containing a first interior space and a second interior space, said enclosure for containing the working fluid; and
   b. a partition located within and extending along at least a portion of said length of said enclosure and separating said first interior space from said second interior space, said partition having a pluralities of capillaries formed therein, each capillary having a sidewall including a surface having formations thereon formed by the melting, and subsequent re-solidification of said sidewall.

2. A heat-transfer system according to claim 1, wherein said partition comprises a first tube.

3. A heat-transfer system according to claim 2, wherein said first tube has a cylindrical cross-sectional shape.

4. A heat-transfer system according to claim 2, wherein said enclosure comprises a second tube and said first tube is located concentrically within said second tube and extends along said length of said enclosure.

5. A heat-transfer system according to claim 1, wherein said partition has first and second surfaces and said longitudinal axis of each capillary is normal to at least one of said first and said second surfaces.

6. A heat-transfer system according to claim 1, wherein at least some of said capillaries comprise holes, each hole having a diameter and a generally circular cross-sectional shape transverse to said longitudinal axis.

7. A heat-transfer system according to claim 6, wherein said diameter is no greater than 20 microns.

8. A heat-transfer system according to claim 6, wherein said diameter is no greater than 6 microns.

9. A heat-transfer system according to claim 1, wherein at least some of said capillaries comprise slots, each slot having a length and a width.

10. A heat-transfer system according to claim 9, wherein said width is no greater than 20 microns.

11. A heat-transfer system according to claim 9, wherein said width is no greater than 6 microns.

12. A heat-transfer system according to claim 1, wherein said partition has a permeability of at least $1\times10^{-15}$ m$^2$.

13. A heat-transfer system according to claim 1, wherein said partition is made of metal.

14. A heat-transfer system according to claim 2, wherein said tube is formed from extruded metal.

15. A heat-transfer system according to claim 1, wherein said enclosure comprises a body having first and second ends, a coaxial fitting attached to said body at said first end, and an end cap attached to said body at said second end.

16. A heat-transfer system according to claim 1, further comprising an evaporator, said evaporator in fluid communication with said first interior space and with said second interior space.

17. A heat-transfer system according to claim 1, further comprising:
   a. a heat sink;
   b. a plurality of said condensers, each of said condensers attached to and in thermal communication with said heat sink;
   c. an evaporator, said evaporator having an inlet and an outlet;
   d. a first header, said first header in fluid communication with said evaporator and with said first interior space of each of said condensers; and
   e. a second header, said second header in fluid communication with said evaporator and with said second interior space of each of said condensers.

18. A heat-transfer system according to claim 17, wherein said heat sink comprises a radiator panel.

19. A heat-transfer system according to claim 17, further comprising a heater attached to at least one of said condensers.

20. A heat-transfer system according to claim 1, each of said plurality of capillaries:
   a. extending between said first interior space and said second interior space along a longitudinal axis such that said first interior space and second interior space are in fluid communication with one another;
   b. being substantially linear and having a substantially uniform cross-section shape transverse to said longitudinal axis; and
   c. having at least one cross-sectional dimension transverse to said longitudinal axis no greater than 50 microns.

21. A heat-transfer system utilizing a working fluid, comprising:
   a condenser assembly, said condenser assembly including:
      a. a plurality of condensers, each condenser having:
         i. an enclosure having an inner surface and a length, said enclosure containing a first interior space and a second interior space, said enclosure for containing the working fluid; and
         ii. a partition located within and extending along at least a portion of said length of said enclosure and separating said first interior space from said second interior space, said partition having a plurality of capillaries formed therein, each of said capillaries having a sidewall including a surface having formations thereon formed by the melting, and subsequent re-solidification of said sidewall
      b. a heat sink, said heat sink in thermal communication with said enclosure of each of said condensers;
      c. a first header, said first header in fluid communication with said first interior space of each of said condensers; and
      d. a second header, said second header in fluid communication with said second interior space of each of said condensers.

22. A heat-transfer system according to claim 21, wherein said partition of each condenser comprises a tube having a solid sidewall in which said capillaries are formed.

23. A heat-transfer system according to claim 22, wherein said tube is made of metal.

24. A heat-transfer system according to claim 23, wherein said tube is made of extruded metal.

25. A heat-transfer system according to claim 21, wherein said heat sink comprises a radiator panel attached to each of said condensers.

26. A heat-transfer system according to claim 21, wherein said artery of each condenser has a permeability of at least $1\times10^{-15}$ m$^2$.

27. A heat-transfer system according to claim 21, further comprising an evaporator, said evaporator being in fluid communication with said first header and said second header.

28. A heat-transfer system according to claim 21, each of said plurality of capillaries:
   a. extending between said first interior space and said second interior space along a longitudinal axis such that said first interior space and second interior space are in fluid communication with one another;
   b. being substantially linear and having a substantially uniform cross-section shape transverse to said longitudinal axis; and c. having at least one cross-sectional dimension transverse to said longitudinal axis no greater than 50 microns.

29. An artery for a heat-transfer device, comprising:
a side wall, said side wall having an outer surface, an inner surface and a plurality of capillaries formed therein, each capillary:
   a. extending from said outer surface to said inner surface along a longitudinal axis,
   b. having a side wall including a surface having formations thereon formed by the melting and subsequent re-solidification of said side wall of said capillary,
   c. being linear and having a substantially uniform cross-sectional shape transverse to said longitudinal axis, and
   d. having at least one dimension transverse to said longitudinal axis that is no greater than 50 microns.

30. An artery according to claim 29, wherein said side wall of said artery has a circular cross-sectional shape.

31. An artery according to claim 29, wherein said longitudinal axis of each capillary is normal to said outer surface.

32. An artery according to claim 29, wherein at least some of said capillaries comprise holes, each hole having a diameter and a generally circular transverse cross-sectional shape.

33. An artery according to claim 29, wherein said diameter of each hole is no greater than 20 microns.

34. An artery according to claim 33, wherein said diameter of each hole is no greater than 6 microns.

35. An artery according to claim 29, wherein at least some of said capillaries comprise slots, each slot having a length and a width.

36. An artery according to claim 35, wherein said width of each slot is no greater than 20 microns.

37. An artery according to claim 35, wherein said width of each slot is no greater than 6 microns.

38. An artery according to claim 29, wherein said side wall of said artery has a permeability of at least $1 \times 10^{-15}$ m.

39. An artery according to claim 29, wherein said side wall of said artery is made of metal.

40. An artery according to claim 39, wherein said side wall of said artery is made of stainless steel.

41. An artery according to claim 29, wherein said side wall of said artery has a thickness that is at least ten times greater than said at least one dimension of each of said capillaries.

* * * * *